US009054256B2

(12) United States Patent  (10) Patent No.: US 9,054,256 B2
Fu et al.  (45) Date of Patent: Jun. 9, 2015

(54) TUNNELING-JUNCTION SOLAR CELL WITH COPPER GRID FOR CONCENTRATED PHOTOVOLTAIC APPLICATION

(75) Inventors: Jianming Fu, Palo Alto, CA (US); Zheng Xu, Pleasanton, CA (US); Jiunn Benjamin Heng, San Jose, CA (US); Chentao Yu, Sunnyvale, CA (US)

(73) Assignee: SolarCity Corporation, San Mateo, CA (US)

( * ) Notice: Subject to any disclaimer, the term of this patent is extended or adjusted under 35 U.S.C. 154(b) by 429 days.

(21) Appl. No.: 13/480,393

(22) Filed: May 24, 2012

(65) Prior Publication Data

US 2012/0305060 A1 Dec. 6, 2012

Related U.S. Application Data

(60) Provisional application No. 61/492,752, filed on Jun. 2, 2011.

(51) Int. Cl.
  *H01L 31/02* (2006.01)
  *H01L 31/0747* (2012.01)
  *H01L 31/18* (2006.01)
  *H01L 31/0224* (2006.01)
  *H01L 31/054* (2014.01)

(52) U.S. Cl.
  CPC ........ *H01L 31/0747* (2013.01); *H01L 31/1804* (2013.01); *Y02E 10/52* (2013.01); *Y02E 10/547* (2013.01); *H01L 31/022433* (2013.01); *H01L 31/054* (2014.12)

(58) Field of Classification Search
  CPC .............. H01L 31/052; H01L 31/0522; H01L 31/1804; H01L 31/0747; H01L 31/0224; H01L 31/0232; H01L 31/0264; H01L 31/0376; Y02E 10/52; Y02E 10/547
  USPC .......................... 136/244, 246, 252, 258, 261
  See application file for complete search history.

(56) References Cited

U.S. PATENT DOCUMENTS

| 2001/0008143 | A1* | 7/2001 | Sasaoka et al. ............... 136/244 |
| 2004/0065363 | A1* | 4/2004 | Fetzer et al. ................... 136/262 |
| 2006/0012000 | A1  | 1/2006 | Estes et al. |
| 2006/0255340 | A1* | 11/2006 | Manivannan et al. .......... 257/79 |
| 2007/0023082 | A1* | 2/2007 | Manivannan et al. ........ 136/258 |

(Continued)

FOREIGN PATENT DOCUMENTS

| CN | 100580957 C | * | 1/2010 |
| GB | 429726 A | * | 6/1935 |

(Continued)

OTHER PUBLICATIONS

CN 100580957 C, Chen P et al., Jan. 2010 English equivalent of the abstract.*

(Continued)

*Primary Examiner* — Susan D Leong
(74) *Attorney, Agent, or Firm* — Shun Yao; Park, Vaughan, Fleming & Dowler LLP

(57) ABSTRACT

One embodiment of the present invention provides a photovoltaic module. The photovoltaic module includes an optical concentrator and a tunneling-junction solar cell. The tunneling junction solar cell includes a base layer, a quantum-tunneling-barrier (QTB) layer situated above the base layer, an emitter layer, a front-side electrode, and a back-side electrode.

19 Claims, 4 Drawing Sheets

(56) References Cited

U.S. PATENT DOCUMENTS

| | | | |
|---|---|---|---|
| 2007/0108437 A1* | 5/2007 | Tavkhelidze | 257/36 |
| 2009/0188561 A1* | 7/2009 | Aiken et al. | 136/259 |
| 2009/0293948 A1* | 12/2009 | Tucci et al. | 136/256 |
| 2011/0297227 A1 | 12/2011 | Pysch et al. | |

FOREIGN PATENT DOCUMENTS

| | | |
|---|---|---|
| JP | 06196766 A * | 7/1994 |
| WO | 91/20097 A1 | 12/1991 |
| WO | 2009150654 A2 | 12/2009 |
| WO | 2010075606 A1 | 7/2010 |
| WO | 2010104726 A2 | 9/2010 |
| WO | 2010123974 A1 | 10/2010 |
| WO | 2011005447 A2 | 1/2011 |
| WO | 2011008881 A2 | 1/2011 |

OTHER PUBLICATIONS

JP 06196766 A, Namigashira, Tsunehiro, Jul. 1994, English equivalent of the abstract.*

* cited by examiner

TUNNELING-JUNCTION SOLAR CELL WITH COPPER GRID FOR CONCENTRATED PHOTOVOLTAIC APPLICATION

RELATED APPLICATION

This application claims the benefit of U.S. Provisional Application No. 61/492,752, entitled "Tunneling Junction Solar Cell with Copper Grid for Concentrated Photovoltaic Application" by inventors Jianming Fu, Zheng Xu, Jiunn Benjamin Heng, and Chentao Yu, filed 2 Jun. 2011.

BACKGROUND

1. Field

This disclosure is generally related to photovoltaic systems. More specifically, this disclosure is related to a photovoltaic system that combines tunneling junction solar cells and optical concentrators.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

Photovoltaic (PV) systems use solar panels to convert sunlight into electricity. A PV system includes multiple components, such as photovoltaic modules (or solar panels), frames, cables, and inverters. The cost of the PV modules contributes significantly to the cost of the entire photovoltaic system. To reduce costs, various approaches have been used to reduce the cost of each component and to improve the efficiency of the photovoltaic module. One approach is to use concentration optics that focuses sunlight to a smaller area, using a PV module that is much smaller than the size of the system. Consequently, the cost of the PV modules within the PV system can be reduced significantly. Although there are additional components, such as optical modules and a tracker, the cost of the whole system is still less than a system without the concentration optics.

There are many challenges in achieving a high-efficiency PV module with concentration optics. When the sunlight is focused to a smaller area, its intensity is greatly increased, resulting in rapid heating of the solar cells. Therefore, cooling is required. However, it is not economical to cool the temperature of the solar cells to as low as around 20° C. Instead, the solar cells will most likely operate at an elevated temperature. This is undesirable because the energy-conversion efficiency of semiconductor solar cells degrades as the temperature rises. The degradation is especially significant for conventional Si-based solar cells, since their temperature coefficient is usually between −0.48 and −0.50%/° C. Although GaAs and other III-V semiconductor-based solar cells perform much better at elevated temperatures, the higher manufacturing cost makes them less desirable.

Another issue with the concentration of sunlight is the current crowding effect. In a solar cell, the current is first generated by light absorbed in the solar cell structure, and then collected by the metal grid on the solar cell surface. The concentration of sunlight causes current crowding in the metal grids, where the current increases almost linearly with the concentration ratio. Current crowding can increase the series resistance of the solar cell. Consequently, as the current increases due to light concentration, the solar cell efficiency decreases because of the increased resistive loss.

Moreover, in conventional solar cells, the front metal grids are manufactured using printed silver paste. To minimize shading, the grids are narrow in width. The height of the screen-printed silver grid is typically limited to no more than 30 microns, and the shape of the cross section is triangular. In addition, the resistivity of silver paste after firing can be five to ten times higher than that of the pure silver, due to additives (such as glass grit or adhesives) in the paste. These factors constrain the series resistance of the metal grid, and negatively impact the solar cell efficiency.

SUMMARY

One embodiment of the present invention provides a photovoltaic module. The photovoltaic module includes an optical concentrator and a tunneling junction solar cell. The tunneling junction solar cell includes a base layer, a quantum-tunneling-barrier (QTB) layer situated above the base layer, an emitter layer, a front-side electrode, and a back-side electrode.

In a variation on the embodiment, the QTB layer includes at least one of: silicon oxide ($SiO_x$), hydrogenated $SiO_x$, silicon nitride ($SiN_x$), hydrogenated $SiN_x$, aluminum oxide ($AlO_x$), silicon oxynitride (SiON), and hydrogenated SiON.

In a variation on the embodiment, the emitter layer includes at least one of: amorphous-Si (a-Si) and amorphous-SiC (a-SiC).

In a variation on the embodiment, the front-side electrode includes a front-side metal grid comprising at least one of: Cu and Ni.

In a further variation, the front-side metal grid is formed using a plating technique.

In a variation on the embodiment, the front-side electrode includes a metal grid line having a curved surface, thereby allowing incident light hitting the curved surface to be reflected downward.

In a variation on the embodiment, the tunneling junction solar cell further comprises a back surface field (BSF) layer situated below the base layer, and the BSF layer includes at least one of: amorphous-Si (a-Si) and amorphous-SiC (a-SiC).

In a variation on the embodiment, the tunneling junction solar cell further comprises a transparent conductive oxide (TCO) layer situated on top of the emitter layer.

In a variation on the embodiment, the base layer comprises at least one of: a monocrystalline silicon wafer and an epitaxially grown crystalline-Si (c-Si) thin film.

In a variation on the embodiment, the tunneling junction solar cell further includes a second QTB layer situated below the base layer.

In a variation on the embodiment, the emitter layer is situated beneath the base layer facing away from incident light.

One embodiment of the present invention includes a photovoltaic system. The system includes an optical module configured to concentrate received sunlight and a solar cell module. The solar cell module includes a multilayer semiconductor structure, a front-side metal grid situated above the multilayer semiconductor structure facing incoming light, and a back-side electrode. The front-side metal grid includes at least one of: Cu and Ni.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a concentrator photovoltaic (CPV) module that is based on tunneling junction solar cells. The concentrator PV module includes an optical focusing mechanism, which concentrates sunlight shone on a larger area to a smaller area, and one or more tunneling junction solar cells. A tunneling junction solar cell includes a crystalline silicon (c-Si) stack, an oxide tunneling barrier-and-passivation layer, and a layer of amorphous semiconductor. In addition, the front metal grid of the solar cells is formed by plating coppers. This type of CPV module exhibits high conversion efficiency (up to 24%) and a low temperature coefficient (as low as −0.20%/° C.).

Tunneling-Junction Solar Cells

Figure 1:
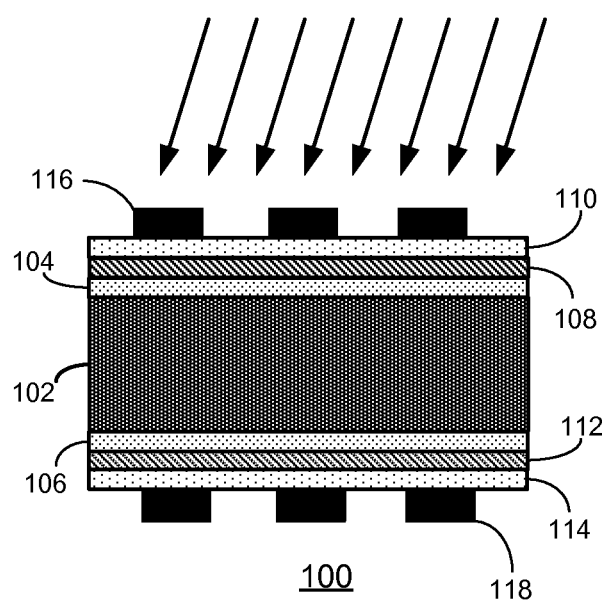
FIG. 1 presents a diagram illustrating an exemplary tunneling-junction solar cell, in accordance with an embodiment of the present invention.

In one embodiment, the solar cells within a CPV module include a double-sided metal-insulator-semiconductor (MIS) tunneling structure with doped front and back amorphous semiconductor layers serving as emitter and BSF, respectively. FIG. 1 presents a diagram illustrating an exemplary tunneling-junction solar cell, in accordance with an embodiment of the present invention. Tunneling junction solar cell 100 includes a substrate 102, ultra-thin silicon oxide layers 104 and 106 covering the surfaces of substrate 102 and passivating the surface-defect states, a front-side doped amorphous Si (a-Si) layer forming an emitter 108, a front-side transparent conducting oxide (TCO) layer 110, a back-side doped a-Si layer forming a BSF layer 112, a back-side TCO layer 114, a front electrode 116, and a back electrode 118. Arrows in FIG. 1 indicate the incident sunlight.

Figure 2:
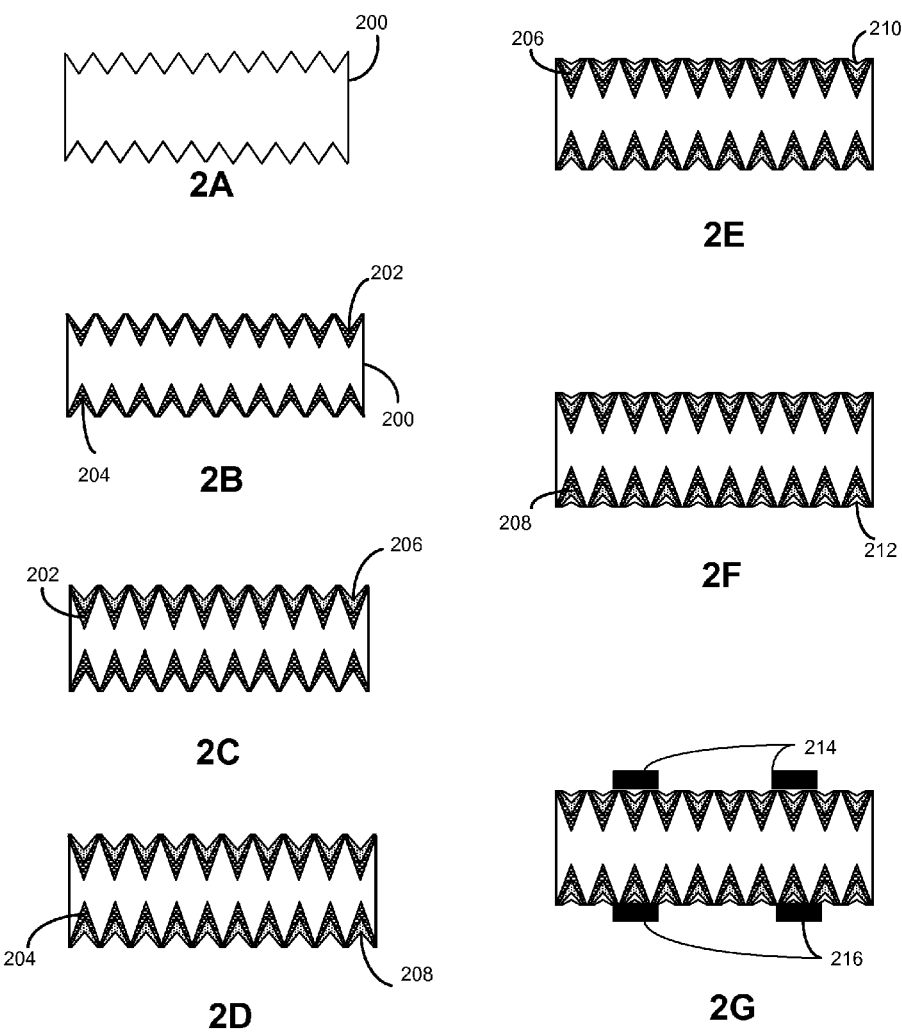
FIG. 2 presents a diagram illustrating the process of fabricating a tunneling junction solar cell, in accordance with an embodiment of the present invention.

Either n- or p-type doped high-quality solar-grade silicon (SG-Si) wafers can be used to build tunneling junction solar cells. In one embodiment, an n-type doped SG-Si wafer is selected. FIG. 2 presents a diagram illustrating the process of fabricating a tunneling junction solar cell in accordance with an embodiment of the present invention.

In operation 2A, a substrate 200 is prepared. In one embodiment, substrate 200 is an SG-Si substrate. The resistivity of the SG-Si substrate is typically in, but not limited to, the range between 0.5 ohm-cm and 10 ohm-cm. In one embodiment, substrate 200 may be a composite base layer that includes an epitaxially formed c-Si enhancing layer deposited on an SG-Si substrate. The doping type of the c-Si enhancing layer is similar to that of the SG-Si substrate. In addition, the c-Si enhancing layer can be either uniformly doped or graded doped. In a further embodiment, the c-Si enhancing layer is uniformly doped with a uniform sheet resistance of 0.5 ohm-cm. In a different embodiment, the c-Si enhancing layer is graded doped with sheet resistance varying between 0.2 ohm-cm and 1 ohm-cm. The thickness of the c-Si enhancing layer can be between 0.5 μm and 2 μm.

The preparation operation includes typical saw damage etching that removes approximately 10 μm of silicon and surface texturing. The surface texture can have various patterns, including but not limited to: hexagonal-pyramid, inverted pyramid, cylinder, cone, ring, and other irregular shapes. In one embodiment, the surface texturing operation results in a random pyramid textured surface. Afterward, substrate 200 goes through extensive surface cleaning.

In operation 2B, a thin layer of high-quality (with defect-interface-state density ($D_{it}$) less than $1\times10^{11}/cm^2$) dielectric material is deposited on the front and back surfaces of SG-Si substrate 200 to form the front and back passivation/tunneling layers 202 and 204, respectively. In one embodiment, only the front surface of SG-Si substrate 200 is deposited with a thin layer of dielectric material. In an alternative embodiment, only the back surface of SG-Si substrate 200 is deposited with a thin layer of dielectric material. Various types of dielectric materials can be used to form the passivation/tunneling layers, including, but not limited to: silicon oxide ($SiO_x$), hydrogenated $SiO_x$, silicon nitride ($SiN_x$), hydrogenated $SiN_x$, aluminum oxide ($AlO_x$), silicon oxynitride (SiON), and hydrogenerated SiON. In addition, various deposition techniques can be used to deposit the passivation/tunneling layers, including, but not limited to: thermal oxidation, atomic layer deposition, wet or steam oxidation, low-pressure radical oxidation, plasma-enhanced chemical-vapor deposition (PECVD), etc. The thickness of the tunneling/passivation layer can be between 1 and 50 angstroms, preferably between 1 and 10 angstroms. Note that the well-controlled thickness of the tunneling/passivation layer ensures good tunneling and passivation effects.

In operation 2C, a layer of hydrogenated, graded-doping a-Si is deposited on front passivation/tunneling layer 202 to form emitter layer 206. As a result, emitter layer 206 is situated on the front side of the solar cell facing the incident sunlight. The doping type of emitter layer 206 is opposite from that of SG-Si substrate 200. If SG-Si substrate 200 is n-type doped, then emitter layer 206 is p-type doped, and vice versa. In one embodiment, emitter layer 206 is p-type doped using boron as dopant. SG-Si substrate 200, front passivation/tunneling layer 202, and emitter layer 206 form the front oxide tunneling junction. The thickness of emitter layer 206 is between 2 and 50 nm. Note that the doping profile of emitter layer 206 can be optimized to ensure good ohmic contact, minimum light absorption, and a large built-in electrical field. In one embodiment, the doping concentration of emitter layer 206 varies from zero to $5\times10^{20}/cm^3$. In a further embodiment, the region within emitter layer 206 that is adjacent to front passivation/tunneling layer 202 is either undoped or having a lower doping concentration, and the region that is away from front passivation/tunneling layer 202 has a higher doping concentration. The lower doping concentration ensures minimum defect density at the interface between front passivation/tunneling layer 202 and emitter layer 206, and the higher concentration on the other side prevents emitter layer depletion. The crystal structure of emitter layer 206 can be amorphous, or nanocrystalline, which enables higher carrier mobility, or protocrystalline, which enables good absorption in the ultra-violet (UV) wavelength range and good transmission in the infrared (IR) wavelength range. All crystalline structures need to preserve the large bandgap of the a-Si. In one embodiment, emitter layer 206 can include carbon-doped a-Si. In a further embodiment, emitter layer 206 can include amorphous silicon carbide or hydrogenated amorphous silicon carbide (a-$Si_{1-x}C_x$:H).

In operation 2D, a layer of hydrogenated, graded-doping a-Si is deposited on the surface of back passivation/tunneling layers 204 to form back surface field (BSF) layer 208. The doping type of BSF layer 208 is the same as that of SG-Si substrate 200. If SG-Si substrate 200 is n-type doped, then BSF layer 208 is also n-type doped, and vise versa. In one embodiment, BSF layer 208 is n-type doped using phosphorous as dopant. SG-Si substrate 200, back passivation/tunneling layer 204, and BSF layer 208 form the back oxide tunneling junction. In one embodiment, the thickness of BSF layer 208 is between 3 and 30 nm. The existence of BSF layer 208 improves the back-side passivation and allows good ohmic contact to a subsequently deposited back transparent conductive oxide (TCO) layer. Similar to emitter layer 206, the region within BSF layer 208 that is adjacent to back passivation/tunneling layer 204 is either undoped or having a lower doping concentration, and the region that is away from back passivation/tunneling layer 204 has a higher doping concentration. The lower doping concentration ensures minimum defect density at the interface between back passivation/tunneling layer 204 and BSF layer 208, and the higher concentration on the other side ensures good ohmic contact to the back TCO layer. In one embodiment, the doping concentration of BSF layer 208 varies from zero to $5 \times 10^{20}/cm^3$. In addition to a-Si, it is also possible to use other material to form BSF layer 208. In one embodiment, a layer of microcrystalline Si is deposited on the surface of back passivation/tunneling layer 204 to form BSF layer 208. Using microcrystalline Si material for BSF layer 208 can ensure lower series resistance and better ohmic contact with the back TCO layer. In a further embodiment, BSF layer 208 can include amorphous silicon carbide or hydrogenated amorphous silicon carbide (a-$Si_{1-x}C_x$:H).

In operation 2E, a layer of TCO material is deposited on the surface of emitter layer 206 to form a conductive anti-reflection layer 210. Examples of TCO include, but are not limited to: indium-tin-oxide (ITO), tin-oxide ($SnO_x$), aluminum doped zinc-oxide (ZnO:Al or AZO), or gallium doped zinc-oxide (ZnO:Ga).

In operation 2F, back-side TCO layer 212 is formed on the surface of BSF layer 208.

In operation 2G, front-side electrode 214 and back-side electrode 216 are formed on the surfaces of TCO layers 210 and 212, respectively. In one embodiment, front-side electrode 214 and/or back-side electrode 216 can include Cu grid formed using various techniques, including, but not limited to: electroless plating, electroplating, sputtering, and evaporation. In a further embodiment, the Cu grid can include a multilayer structure, such as a Cu/Sn bi-layer structure, or a Cu/Ag bi-layer structure. Note that the plated Cu metal grids typically have a cross section that is square in shape, and is at least 20 μm in height and can be as tall as 50 μm or higher. This results in the cross-section area of the plated Cu grid being much larger than conventional screen-printed Ag grid and, thus, the series resistance of the plated Cu grid being much smaller than that of the Ag grid. Moreover, the resistivity of the plated Cu is around $1.8 \times 10^{-6}$ ohm-cm, which is close to that of pure Cu.

To improve the adhesion of the copper grids to the TCO layers and prevent the diffusion of copper to silicon layers under the TCO, an optional barrier/adhesion layer can be formed between the copper grids and TCO. Materials used to form this optional barrier/adhesion layer include, but are not limited to: Ti, TiN, TiW, Ta, TaN, WN, Co, or their combination. In one embodiment, an optional barrier/adhesion layer is deposited on top of the TCO layers 210 and 212, followed by the deposition of copper grids 214 and 216.

Note that the front-side electrode of a solar cell typically includes thin grid lines of so-called fingers connected to wider metal lines, which are called busbars. The typical width of the finger grid lines is between 40 and 100 μm, and the typical width of the busbars is between 1 and 2 mm. Compared with solar cells used for non-CPV (1-sun) application, in order to reduce the series resistance, certain tradeoffs are needed for solar cells used for CPV application. One way to reduce the series resistance is to increase the number of grid lines by reducing the pitch between the fingers. The other way is to increase the number of busbars, thus decreasing the length of each section of the grid lines. However, both methods increase the total area of the electrode, leading to increased shading effect. For 1-sun applications, conventional solar cells with printed silver electrodes typically have a distance between the grid lines between 2 and 2.5 mm, and a sectional length of the grid lines between 30 and 35 mm. For CPV applications, such as 5 to 10 sun concentration, the pitch and the length of the grid lines are reduced to less than 1 mm and 25 mm, respectively. This can significantly increase shading. However, in embodiments of the present invention, by using plated copper electrodes, the need for increasing the density of the grid lines or busbars can be reduced to none, thus leading to a higher overall conversion efficiency.

To minimize shading, in one embodiment, front-side electrode 214 includes parallel metal grid lines having cross sections with curved perimeters. In other words, the metal grid lines have a curved surface. At any given point of the curved surface, the angle formed by a plane, which is tangent to the curved surface, and the solar cell surface is ideally between 45° and 90°. In a further embodiment, the angle is between 67.5° and 90°. This ensures that incident sunlight hitting any point on the curved surface of the grid lines is reflected downward to be absorbed by the solar cell. The vertical aspect ratio of the metal grid lines is greater than 2.5 to minimize resistive loss.

Figure 3:
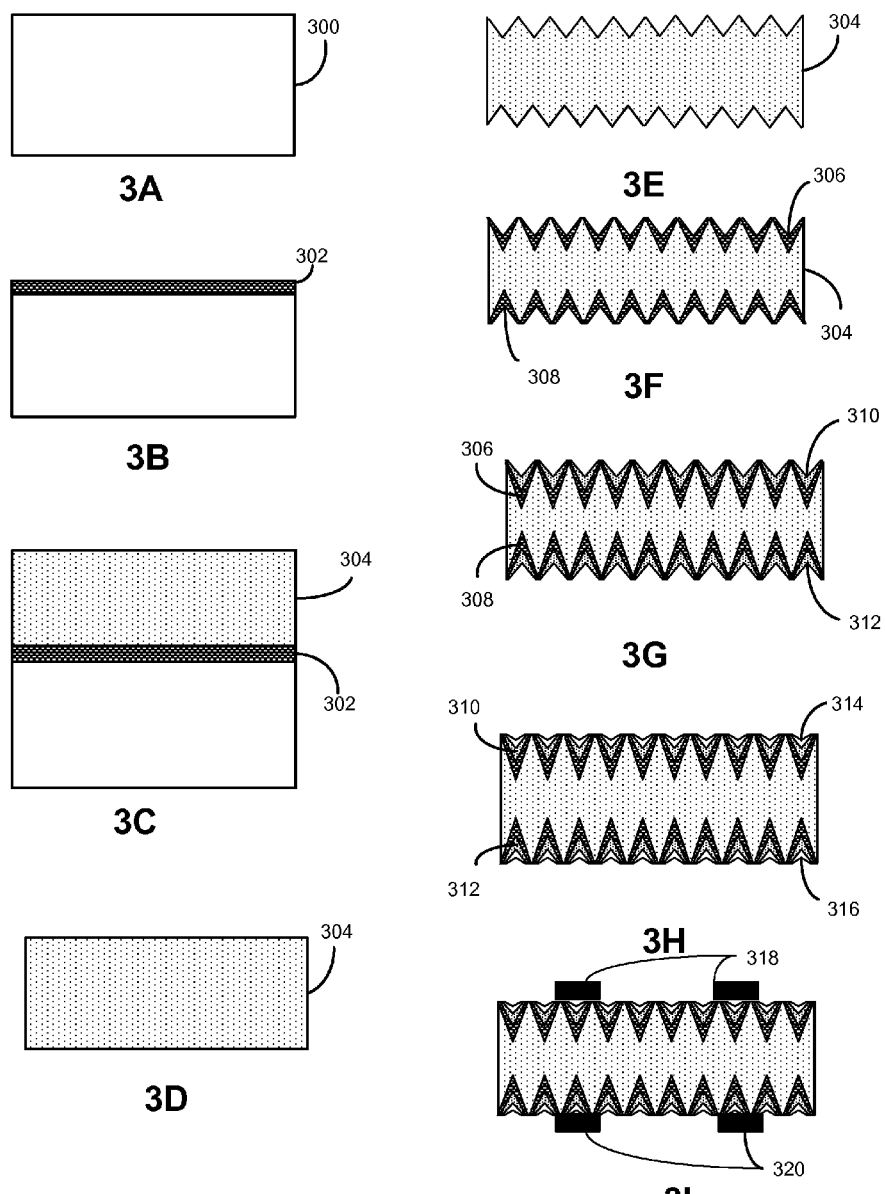
FIG. 3 presents a diagram illustrating the process of fabricating a tunneling junction solar cell, in accordance with an embodiment of the present invention.

In addition to the process shown in FIG. 2, other ways of fabricating the tunneling junction solar cells are also possible. In one embodiment, instead of an SG-Si wafer, the base layer of the tunneling junction solar cell is a layer of epitaxially grown c-Si. FIG. 3 presents a diagram illustrating the process of fabricating a tunneling junction solar cell, in accordance with an embodiment of the present invention.

In operation 3A, an SG-Si substrate 300 is prepared using a process similar to that of operation 2A, except that no surface texturing is formed.

In operation 3B, a thin layer of heavily doped c-Si, layer 302, is epitaxially grown on SG-Si substrate 300. In one embodiment, heavily doped c-Si epitaxial (EPI) layer 302 is formed using a chemical-vapor-deposition (CVD) epitaxial process. Various types of Si compounds, such as $SiH_4$, $SiH_2Cl_2$, and $SiHCl_3$, can be used as a precursor in the CVD process to form heavily doped c-Si EPI layer 302. In one embodiment, $SiHCl_3$ (TCS) is used due to its abundance and low cost. The thickness of heavily doped c-Si EPI layer 302 can be between 1 μm and 5 μm. The doping type of heavily doped c-Si EPI layer 302 is the same as the doping type of SG-Si substrate 300. In one embodiment, heavily doped c-Si EPI layer 302 is n-type doped. The doping concentration of heavily doped c-Si EPI layer 302 can be between $1 \times 10^{17}/cm^3$ and $1×10^{20}/cm^3$. The doping level should not exceed a maximum limit, which may cause misfit dislocations in the film. Heavily doped c-Si EPI layer 302 can act as a back surface field (BSF), an impurity barrier, and a contaminant getter layer for reducing electron-hole recombination at the surface of the subsequently grown base layer.

In operation 3C, a layer of lightly doped c-Si is epitaxially grown on heavily doped c-Si EPI layer 302 to form a base layer 304. The process used for the growth of base layer 304 is similar to the one used for the growth of heavily doped c-Si EPI layer 302. In one embodiment, a CVD EPI process is used to form base layer 304. The thickness of base layer 304 can be between 20 μm and 100 μm. The doping type of base layer 304 is the same as the doping type of SG-Si substrate 300 and heavily doped c-Si EPI layer 302. In one embodiment, base layer 304 is n-type doped, which can provide better carrier lifetime, higher $V_{oc}$, and higher solar cell efficiency. The doping concentration of base layer 304 can be between $1×10^{15}/cm^3$ and $1×10^{17}/cm^3$. In a further embodiment, base layer 304 can be a layer of c-Si with graded doping. The doping concentration of base layer 304 can be between $1×10^{14}/cm^3$ and $1×10^{18}/cm^3$, with the region adjacent to heavily doped c-Si EPI layer 302 having a higher doping concentration and the opposite side having a lower doping concentration. Such a doping profile results in an electric field that allows the generated minority carriers to drift toward the junction, thus increasing the $J_{sc}$. In a further embodiment, a thin layer of intrinsic EPI c-Si is inserted within graded-doped base layer 304. The thickness of the intrinsic EPI c-Si layer can be between 1 and 10 nm. The insertion of the intrinsic EPI c-Si layer ensures better film quality of graded-doped base layer 304 because it limits defect propagation and lattice mismatch during the EPI growth of base layer 304. Note that the intrinsic EPI c-Si layer can be deposited at any point during the growth of graded-doped base layer 304 by changing the gas flow into the epitaxial chamber After EPI growth of base layer 304, in operation 3D, SG-Si substrate 300 and heavily doped c-Si EPI layer 302 are removed. Various techniques can be used to remove SG-Si substrate 300 and heavily doped c-Si EPI layer 302, including, but not limited to: mechanical grinding, chemical wet etching, dry etching, and chemical mechanical polishing. In one embodiment, a mechanical backgrinding method is used to remove SG-Si substrate 300 and heavily doped c-Si EPI layer 302. Subsequently, a wet chemical etching process is used to remove all backgrind damage which may result in increased minority-carrier recombination, thus degrading the solar cell performance. Solutions used in the wet chemical etching include, but are not limited to: sodium hydroxide (NaOH), tetramethylammonium hydroxide (TMAH), and a mixture of nitric acid and hydrofluoric acid ($HNO_3$:HF).

In operation 3E, the front and back surfaces of base layer 304 are textured to maximize light absorption inside the solar cell, thus further enhancing solar cell conversion efficiency. The shapes of the surface texture can be pyramids or inverted pyramids, which are randomly or regularly distributed on the front and back surfaces of base layer 304.

The rest of the fabrication process is similar to the one shown in FIG. 2. In operation 3F, front and back passivation/tunneling layers 306 and 308 are formed using a process similar to operation 2B.

In operation 3G, emitter layer 310 and BSF layer 312 are formed using a process similar to the one used in operations 2C and 2D.

In operation 3H, front and back TCO layers 314 and 316 are formed using a process similar to the one used in operations 2E and 2F.

In operation 3I, front and back electrodes 318 and 320 are formed using a process similar to the one used in operation 2G.

In addition to the examples shown in FIGS. 2 and 3, it is also possible to fabricate tunneling junction solar cells with an emitter layer (which has an opposite doping type as that of the base layer) situated on the backside of the solar cell. In one embodiment, a p-type doped emitter layer having high defect density is deposited on the surface of the back tunneling/passivation layer, and a front surface field (FSF) layer (which has a same doping type as that of the base layer) is deposited on the surface of the front tunneling/passivation layer. Because the emitter is now facing away from the incoming light, loss of current due to short wavelength absorption near the front surface of the solar cell can be minimized. In addition, the emitter can be made thicker to eliminate emitter depletion effect without compromising on current loss due to short wavelength absorption. The thicker emitter also provides additional flexibility in tuning the p-type doped emitter work function to match that of the back TCO layer, or makes it possible to use a more optimal back TCO material without being constrained by its transmission properties. Moreover, because the backside tunneling junction is impacted by long wavelength lower energy absorption, it is less affected by higher energy excess carrier recombination.

Figure 4:
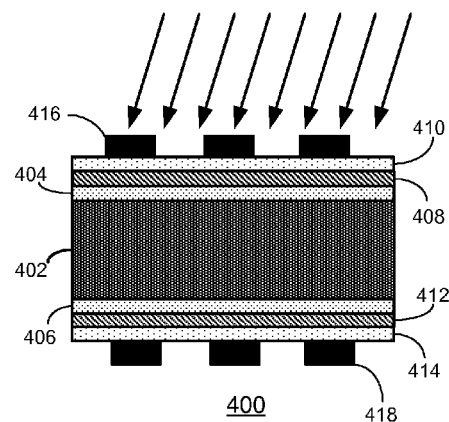
FIG. 4 presents a diagram illustrating an exemplary back tunneling junction solar cell, in accordance with an embodiment of the present invention.

FIG. 4 presents a diagram illustrating an exemplary back tunneling junction solar cell, in accordance with an embodiment of the present invention. Back tunneling junction solar cell 400 includes an n-type doped substrate 402, QTB layers 404 and 406 covering the front and back surfaces of substrate 402, an $n^+$ doped a-Si layer 408 acting as a front-surface-field (FSF) layer, a front-side transparent conducting oxide (TCO) layer 410, a back-side p-type doped a-Si emitter layer 412, a back-side TCO layer 414, a front electrode 416, and a back electrode 418. Arrows in FIG. 4 indicate the incident sunlight.

The advantages of the tunneling junction solar cells include high conversation efficiency (up to 24%), and a low temperature coefficient (as low as −0.20%/° C.), which is less than half of that of conventional crystalline Si-based solar cells. The low temperature coefficient allows the tunneling junction solar cells to convert solar energy to electricity more efficiently in comparison with conventional solar cells at elevated temperature. For example, at an elevated temperature of 75° C., the tunneling junction solar cells produce 12-15% more electricity than conventional solar cells with the same nameplate power. Note that the nameplate power is the value of the produced power under standard operation condition (at 25° C.).

The aforementioned copper grids can also benefit solar cells with other types of junction, such as p-n junctions formed by diffusion, for CPV application. These solar cells may not include TCO layers. In such a scenario, the copper grid lines are situated above the silicon layer (such as the emitter), and a barrier layer comprising Ti, TiN, TiW, Ta, TaN, WN, Ni, Co, or their combination is formed between the silicon layer and the copper grid.

CPV Module

Figure 5:
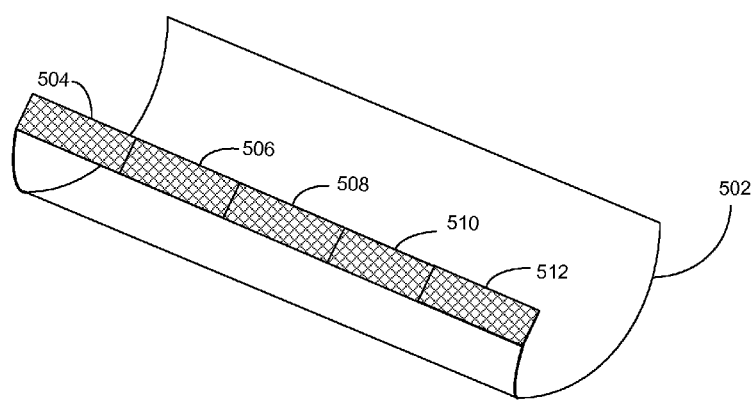
FIG. 5 presents a diagram illustrating an exemplary concentrator photovoltaic (CPV) module, in accordance with an embodiment of the present invention.

FIG. 5 presents a diagram illustrating an exemplary concentrator photovoltaic (CPV) module, in accordance with an embodiment of the present invention. CPV module 500 includes a solar concentrator 502 and a number of solar cells, such as solar cells 504, 506, 508, 510, and 51-2, placed adjacent to each other, forming a solar stripe. Solar concentrator 502 concentrates the sunlight shone on it to solar cells 504-512, all of which have a much smaller surface area compared with the size of the entire module. Solar cells 504-512 are placed at or near the focus point of concentrator 502. In one embodiment, solar cells 504-512 are electrically connected in series. The orientation of concentrator 502 can be adjusted based on the time of the day and the season to maximize the absorption of the sunlight.

Concentrator 502 can be implemented using various available optical focusing techniques, including but not limited to reflection or refraction though an optical media. For example, concentrator 502 can be a focusing lens or mirror. In FIG. 5, concentrator 502 is a parabolic reflecting mirror, and solar cells 504-512 are placed near or on the line of focus of the parabolic trough. Other light-concentrating techniques are also possible. For example, concentrator 502 can be a parabolic dish reflector. In addition, instead of a continuous parabolic plane, concentrator 502 may comprise a large number of flat mirror facets mounted on a cylindrical or parabolic support substrate. The manufacture cost of the flat mirrors is much lower than that of a parabolic dish or trough.

Solar cells 504-512 can be any type of solar cells. In one embodiment, solar cells 504-512 include tunneling junction solar cells, which can have the junction at either the frontside or the backside. The tunneling junction solar cells have a much lower temperature coefficient (as low as −0.20%/° C.), thus having a higher cell efficiency at an elevated temperature compared with other types of solar cells. Note that, due to the existence of concentrator 502, solar cells 504-512 often work at a higher temperature even with cooling (the cooling system is not shown in FIG. 5). In one more embodiment, solar cells 504-512 can be any type of solar cells that use the plated Cu grid as front-side metal grid on the light-facing surface. The lower resistivity of the plated Cu and the larger cross-section area of the Cu grid lines minimize resistive loss, which can be a significant loss factor in a CPV due to the current crowding effect. In a further embodiment, the Cu grid includes parallel grid lines having a curved surface to eliminate the shading effect.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A photovoltaic module, comprising:
   an optical concentrator; and
   a tunneling-junction solar cell, comprising:
   a crystalline silicon base layer,
   a first dielectric quantum-tunneling-barrier layer positioned on and in direct contact with a first surface of the crystalline silicon base layer,
   a second dielectric quantum-tunneling-barrier layer positioned on and in direct contact with a second surface of the crystalline silicon base layer,
   an amorphous silicon based emitter layer,
   a first electrode positioned on a first side of the crystalline silicon base layer, and
   a second electrode positioned on a second side of the crystalline silicon base layer.

2. The photovoltaic module of claim 1, wherein the quantum-tunneling-barrier layers comprise at least one of:
   silicon oxide ($SiO_x$);
   hydrogenated $SiO_x$;
   silicon nitride ($SiN_x$);
   hydrogenated $SiN_x$;
   aluminum oxide ($AlO_x$);
   silicon oxynitride (SiON); and
   hydrogenated SiON.

3. The photovoltaic module of claim 1, wherein the emitter layer comprises at least one of:
   amorphous-Si (a-Si); and
   amorphous-SiC (a-SiC).

4. The photovoltaic module of claim 1, wherein the first electrode includes a metal grid comprising at least one of: Cu and Ni.

5. The photovoltaic module of claim 4, wherein the metal grid is formed using a plating technique.

6. The photovoltaic module of claim 1, wherein the first electrode includes a metal grid line having a curved surface, thereby allowing incident light hitting the curved surface to be reflected downward.

7. The photovoltaic module of claim 1, wherein the tunneling-junction solar cell further comprises a surface field layer, and wherein the surface field layer includes at least one of: amorphous-Si (a-Si) and amorphous-SiC (a-SiC).

8. The photovoltaic module of claim 1, wherein the emitter layer is positioned between the crystalline silicon base layer and the second electrode, and wherein the tunneling-junction solar cell further comprises a transparent conductive oxide layer positioned between the emitter layer and the second electrode.

9. The photovoltaic module of claim 1, wherein the crystalline silicon base layer comprises at least one of:
   a monocrystalline silicon wafer; and
   an epitaxially grown crystalline-Si (c-Si) thin film.

10. A photovoltaic system, comprising:
    an optical module configured to concentrate received sunlight; and
    a solar cell module, comprising:
    a multilayer semiconductor structure, wherein the multilayer semiconductor structure further comprises a crystalline silicon base layer, a first dielectric quantum-tunneling-barrier layer positioned on and in direct contact with a first surface of the crystalline silicon base layer, a second dielectric quantum-tunneling-barrier layer positioned on and in direct contact with a second surface of the crystalline silicon base layer, and an emitter layer;
    a first electrode comprising a metal grid positioned on a first side of the multilayer semiconductor structure, wherein the metal grid includes at least one of: Cu and Ni, and
    a second electrode positioned on a second side of the multilayer semiconductor structure.

11. The photovoltaic system of claim 10, wherein the metal grid is formed using a plating technique.

12. The photovoltaic system of claim 10, wherein the metal grid includes a metal grid line having a curved surface, thereby allowing incident light hitting the curved surface to be reflected downward.

13. The photovoltaic system of claim 10, wherein the crystalline silicon base layer comprises at least one of:
    a monocrystalline silicon wafer; and
    an epitaxially grown crystalline-Si (c-Si) thin film.

14. The photovoltaic system of claim 10, wherein the quantum-tunneling-barrier layers comprise at least one of:
    silicon oxide ($SiO_x$);
    hydrogenated $SiO_x$;
    silicon nitride ($SiN_x$);
    hydrogenated $SiN_x$;
    aluminum oxide ($AlO_x$);
    silicon oxynitride (SiON); and
    hydrogenated SiON.

15. The photovoltaic system of claim 10, wherein the emitter layer comprises at least one of:

amorphous-Si (a-Si); and
amorphous-SiC (a-SiC).

16. The photovoltaic system of claim 10, wherein the multilayer semiconductor structure further comprises a surface field layer, and wherein the surface field layer includes at least one of: amorphous-Si (a-Si) and amorphous-SiC (a-SiC).

17. The photovoltaic system of claim 10, wherein the emitter layer is positioned between the crystalline silicon base layer and the second electrode, and wherein the multilayer semiconductor structure further comprises a transparent conductive oxide layer positioned between the emitter layer and the second electrode.

18. The photovoltaic module of claim 7, wherein the surface field layer is positioned between the first dielectric quantum-tunneling-barrier layer and the first electrode.

19. The photovoltaic system of claim 16, wherein the surface field layer is positioned between the first dielectric quantum-tunneling-barrier layer and the first electrode.

* * * * *